US006246351B1

(12) United States Patent
Yilmaz

(10) Patent No.: US 6,246,351 B1
(45) Date of Patent: Jun. 12, 2001

(54) LSB INTERPOLATION CIRCUIT AND METHOD FOR SEGMENTED DIGITAL-TO-ANALOG CONVERTER

(75) Inventor: Abdullah Yilmaz, Tucson, AZ (US)

(73) Assignee: Burr-Brown Corporation, Tucson, AZ (US)

( * ) Notice: Subject to any disclaimer, the term of this patent is extended or adjusted under 35 U.S.C. 154(b) by 0 days.

(21) Appl. No.: 09/413,764

(22) Filed: Oct. 7, 1999

(51) Int. Cl.[7] ................................................... H03M 1/66
(52) U.S. Cl. ........................................ 341/145; 341/136
(58) Field of Search ................................ 341/136, 144, 341/145, 153, 154

(56) References Cited

U.S. PATENT DOCUMENTS

| 4,978,959 | 12/1990 | Chong et al. | 341/161 |
|---|---|---|---|
| 5,396,245 | 3/1995 | Rempfer | 341/145 |
| 5,489,904 | 2/1996 | Hadidi | 341/156 |
| 5,731,774 | * 3/1998 | Fujii et al. | 341/145 |
| 5,801,655 | 9/1998 | Imamura | 341/145 |
| 5,859,606 | 1/1999 | Schrader et al. | 341/144 |

OTHER PUBLICATIONS

"A Multiple Input Differential Amplifier Based on Charge Sharing on a Floating–Gate MOSFET" by Kewei Yang and Andreas G. Andreou, Analog Integrated Circuits and Signal Processing, 6, 197–208 (1994), pp. 21–32.

A Versatile Building Block: The CMOS Differential Difference Amplifier by Eduard Säckinger and Walter Guggenbühl, IEEE Journal of Solid–State Circuits, vol. SC–22, No. 2, Apr. 1987. pp. 287–294.

SP23.4: A 12b 28–Channel Trimless DAC, by Makoto Imamura and Keisuke Kuwahara, ISSCC97, Session 23, Analog Technologies, Paper SP23.4.

* cited by examiner

Primary Examiner—Howard L. Williams
(74) Attorney, Agent, or Firm—Cahill, Sutton & Thomas P.L.C.

(57) ABSTRACT

A segmented digital-to-analog converter includes a string DAC (210) and an interpolation DAC (211). The string DAC includes $2^M$ series-connected string resistors (Ri) and $2^M$ pairs of switches (Sia,b). The switch pairs couple a first (201) and second (202) conductor across each resister responsive to the MSB subword decoder (212). The interpolation DAC (211), responsive to the LSB subword decoder (215), connects an input of a plurality of differential stages to the first conductor (201) and second (202) conductor. Each differential stage includes a first transistor ($Q_{jA}$) and a second ($Q_{jB}$) transistor differentially coupled to a corresponding tail current source ($I_n$). The drains of the first ($Q_{jA}$) and second ($Q_{jB}$) transistors are connected to a first load device ($Q_{L1}$) and second ($Q_{L2}$) load device and the inverting and non-inverting inputs of the output amplifier (205) via third (203) and forth (204) conductors, respectively.

21 Claims, 7 Drawing Sheets

US 6,246,351 B1

LSB INTERPOLATION CIRCUIT AND METHOD FOR SEGMENTED DIGITAL-TO-ANALOG CONVERTER

BACKGROUND OF THE INVENTION

The invention relates to segmented digital-to-analog converters (DACs), and more particularly to segmented string DACs, and still more particularly to LSB interpolation circuits which avoid large non-linearities that are associated with prior interpolation circuits that modulate the offset voltage of a differential buffer amplifier in response to LSB subword signals applied to the DAC.

Those skilled in the art know that various DAC architectures are available, including clocked DACs and static DACs. It is also known that a static DAC architecture should be used if low, long term drift performance is required. Some static DAC architectures, such as those including R2R ladder networks and those including switched current sources, are not inherently monotonic and must either be "trimmed" or digitally calibrated, at substantial additional cost to ensure the monotonicity which is essential for some applications.

String DACs are a type of static DAC that includes a plurality of resistors connected in series between a high reference voltage and a low reference voltage, wherein the various connecting nodes between the resistors constitute tap points that are selectively switched to an output node in response to the digital input, and the voltage of the tap point selectively switched to the output node is an inherently monotonic analog representation of the digital input. For an N-bit DAC, $2^N-1$ tap point voltage levels are required, so $2^N$ resistors are required for a string DAC. This number of resistors is too large to be practical for more than approximately eight bits, unless the DAC is segmented into a string DAC section and an interpolation DAC section, in which case the interpolation section also must be inherently monotonic to ensure that the entire DAC is monotonic.

The closest prior art is believed to be U.S. Pat. No. 5,396,245, issued Mar. 7, 1995 to William C. Rempfer and assigned to Linear Technology Corporation; this patent discloses a string DAC with a monotonic interpolation circuit. Since both the string DAC section and the interpolation section are inherently monotonic, the entire DAC also is inherently monotonic. FIG. 1 hereof is a copy of FIG. 5 of the '245 patent.

Referring to FIG. 1, the prior art segmented DAC 500 includes a string 401 of resistive elements all of equal resistance. The lower terminal of each resistive element is connected by a corresponding lower switch to a first conductor, and the upper terminal of each resistive element is connected by a corresponding upper switch to a second conductor. A pair of switches constituting a lower switch and an upper switch thus is associated with each resistive element. An "MSB subword" of the digital input word applied to DAC 500 is decoded to close one of the pairs of switches so that the difference between a voltage $V_2$ produced on the second conductor and a voltage $V_1$ produced on the first conductor is the voltage drop across the associated resistive element of resistive string 401. The string of resistors 401 and the corresponding set of pairs of switches 402 constitute a "string DAC", and the voltage $V_1$ is a "coarse" analog representation of the MSB subword. The coarse analog representation $V_1$ is necessarily monotonic because an increased value of the MSB digital input subword always results in an increased value of $V_1$. $2^M$ resistive elements are used in resistive string 401 if the MSB subword has M bits.

The segmented DAC 500 of prior art FIG. 1 also includes an interpolation DAC which produces a "fine" interpolation of the voltage drop $V_2-V_1$ across the resistive element selected by the M-bit MSB subword, wherein the interpolation occurs in response to an N-bit LSB subword. The interpolation DAC includes a single differential transconductance stage 408 in which monotonicity is assured by modulation of the offset voltage of the differential transconductance stage 408. This is accomplished by providing $2^N$ P-channel "subtransistors" 409a, 409b, 409c, and 409d in block 409 and $2^N$ P-channel subtransistors 410a,b,c,d in block 410, with the source electrodes of subtransistors 409a,b,c,d and 410a,b,c,d connected to a single tail current source 411. The gate of subtransistor 409a is permanently connected to $V_1$. The gates of subtransistors 409b,c,d are selectively connected to either $V_1$ or $V_2$ by switches 405, 406, and 407, respectively in response to the decoding of the N-bit LSB subword. For an N-bit LSB subword, there would be $2^N-1$ such switches and $2^N$ subtransistors in block 409, and the N-bit LSB subword is decoded so as to select various combinations of the subtransistors 409b,c,d so that each increment in the value of the N-bit LSB subword switches the gate of an additional one of subtransistors 409b,c,d from $V_1$ to $V_2$.

The gates of subtransistors 410a,b,c,d all are connected to the output of an inverting amplifier 108 having its input connected to the first output of differential transconductance stage 408. The input of amplifier 108 is connected to the drain electrodes of subtransistors 409a,b,c,d and the drain electrode of an N-channel transistor 105 having its source connected to V− and its gate connected to the gate and drain of an N-channel transistor 106 having its source connected to V−. The drain of transistor 106 is connected to the drains of subtransistors 410a,b,c,d. N-channel transistors 105 and 106 constitute a current mirror load circuit for differential transconductance stage 408. The subtransistors 409a–d and the subtransistors 410a–d have substantially equal geometries.

Incrementing the N-bit LSB subword by one causes the $2^N-1$ switches in block 404 to switch one more of the subtransistors 409b,c,d from $V_1$ to $V_2$, which modulates the input offset voltage of differential transconductance stage 408. This ensures that DAC 500 of prior art FIG. 1 provides monotonic digital-to-analog conversion.

Unfortunately, the interpolation DAC of prior art FIG. 1 is very non-linear. Curve A of FIG. 4 shows the large, non-linear error as a function of the LSB subword value.

Accordingly, there is a need for a segmented DAC including a resistive MSB string DAC and an LSB interpolation DAC that ensures a monotonic output as is accomplished by the circuit of prior art FIG. 1, but without the non-linearity caused by the interpolation DAC.

SUMMARY OF THE INVENTION

Accordingly, it is an object of the invention to provide a segmented DAC providing an interpolation stage which is guaranteed to be monotonic, but which avoids the non-linearity of the closest prior art.

It is another object of the invention to provide reduced integrated circuit die area required by a conventional unsegmented DAC.

It is another object of the invention to provide a monotonic DAC at least 12 bits on an integrated circuit die small enough to fit within a standard SOT23 package.

Briefly described, and in accordance with one embodiment thereof, the invention provides an M+N bit segmented digital-to-analog converter (DAC) for monotonically converting an M+N bit input word to an analog output signal, including a string DAC (210) and an interpolation DAC 211. The string DAC includes $2^M$ series-connected string resistors (Ri), $2^M$ pairs of switches (Sia,b) coupling a first terminal of each string resistor to a first conductor (201) and a second terminal of each resistor to a second conductor (202), and an MSB subword logic circuit (212) adapted to selectively actuate the pairs of switches to electrically couple voltages on the first and second terminals of selected string resistors to the first (201) and second (202) conductors, respectively. The interpolation DAC (211) includes an LSB subword logic circuit (215) adapted to produce successive switch actuation signals (217) in response to successive increments in the value of the LSB subword, a plurality of differential stages each including a first transistor ($Q_{jA}$) and a second transistor ($Q_{jB}$) each having a source coupled to a corresponding current source ($I_j$), an output amplifier (205) producing an output voltage ($V_{OUT}$) coupled to a gate of each of the second transistors ($Q_{jB}$), a plurality of switch circuits ($SW_{ja,b}$) adapted to successively electrically couple or decouple gates of corresponding first transistors ($Q_{jA}$) to or from the first (201) or second (202) conductors, respectively, in response to incremental increases in the value of the LSB subword, respectively, and load circuitry including a first load device ($Q_{L1}$) coupled by a third conductor (203) to the drains of the first transistors ($Q_{jA}$) and an inverting input of the output amplifier (205), and a second load device ($Q_{L2}$) coupled by a fourth conductor (204) to the drains of the second transistors ($Q_{jB}$) and a non-inverting input of the output amplifier (205). In one embodiment, the first and second load devices are folded cascode transistors.

In accordance with another emobdiment, the invention provides an interpolation circuit (211) for digitally interpolating between a first voltage ($V_1$) on a first conductor (201) and a second voltage ($V_2$) on a second conductor (202), including a plurality of voltage-to-current converter circuits (16-0,1 . . . ) each including a non-inverting input and inverting input. An amplifier (205) is coupled to produce an output voltage ($V_{OUT}$) in response to the sum of a plurality of currents produced by the plurality of voltage-to-current converter circuits, the output voltage ($V_{OUT}$) being coupled to the inverting input of each of the voltage-to-current converter circuits.

DETAILED DESCRIPTION OF THE PREFERRED EMBODIMENTS

Figure 2:
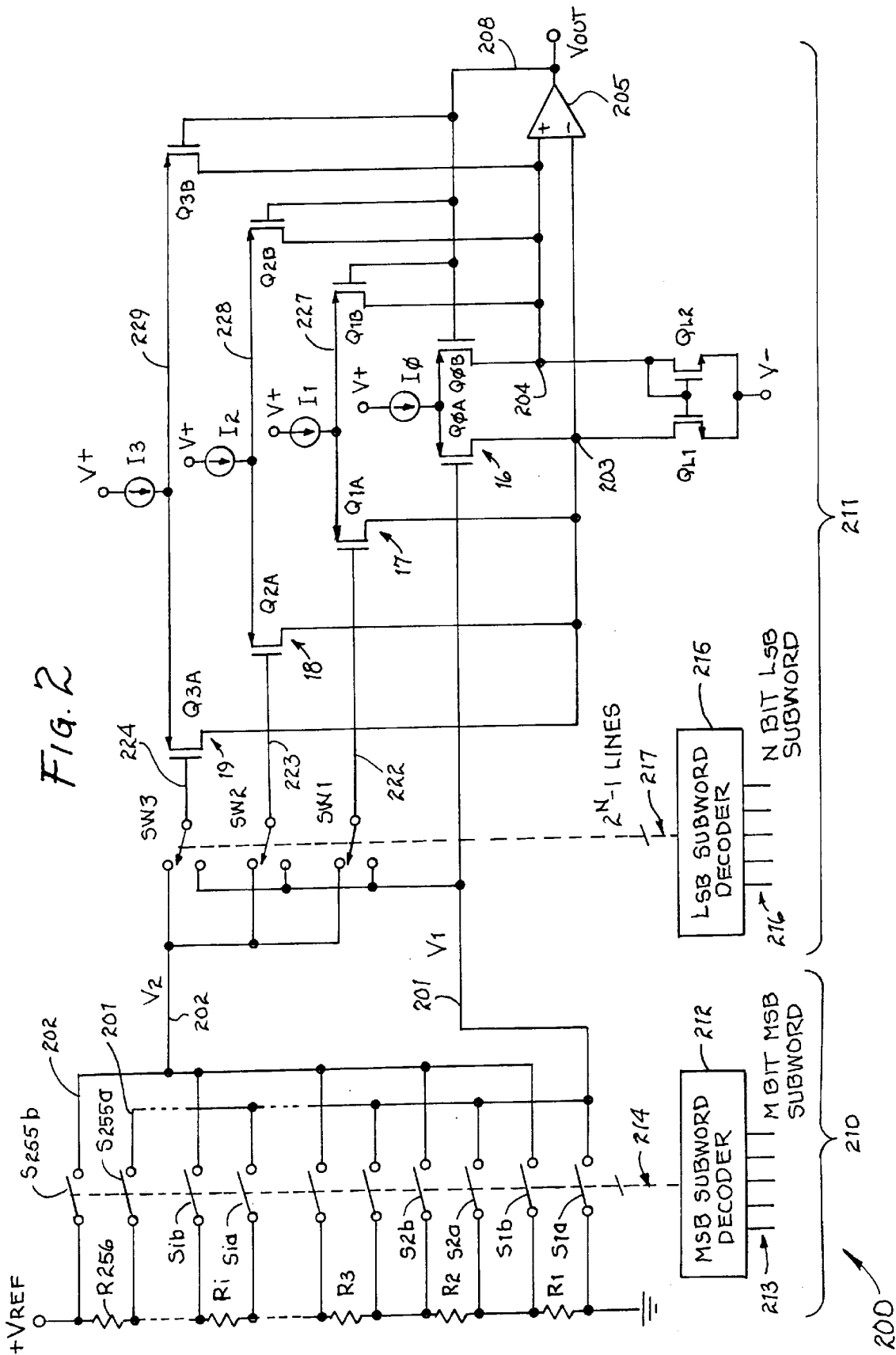
FIG. 2 is a schematic diagram of the digital-to-analog converter of the present invention.

Referring to FIG. 2, segmented DAC 200 includes a "coarse" resistive string DAC 210 and a "fine" interpolation DAC 211. String DAC 210 includes $2^M$ equal string resistors (where M is selected to be 8 for the present example) including R1,2 . . . Ri . . . R256 connected in series between a reference ground conductor and a reference voltage $+V_{REF}$. The top string resistor R256 is connected to $+V_{REF}$. A pair of switches including a lower switch Sia and an upper switch Sib are associated with each string resistor, respectively. For the ith string resistor Ri (where i is any integer from 1 to 256), the bottom switch Sia of the ith pair selectively connects the bottom terminal of string resistor Ri to a conductor 201 to produce a voltage $V_1$ thereon. The upper switch Sib of each pair selectively connects the top terminal of the string resistor Ri to conductor 202 to produce a voltage $V_2$ thereon.

An M-bit MSB subword is applied to MSB input conductors 213 of an MSB subword decoder 212, which selects one of a plurality of conductors indicated collectively by dotted line 214 to close the pair of switches Sia and Sib associated with the string resistor Ri selected by the M-bit MSB subword. The closed switches Sia and Sib produce a value of $V_1$ on conductor 201 equal to the voltage at the bottom terminal of the selected resistor Ri, and a value of $V_2$ on conductor 202 equal to the voltage at the top terminal of the selected resistor Ri.

For example, if the MSB subword consists of all "1"s, then the signals on the various conductors 214 turn on switches $S_{256b}$ and $S_{256a}$ and turn off all of switches Sia and Sib of FIG. 2. $V_2$ then is equal to $+V_{REF}$; $V_1$ is equal to the voltage on the lower terminal of resistor R256, which is equal to $+V_{REF}$ minus the value of the voltage drop across top resistor R256. Thus, $V_1$ represents a "coarse" representation of the M+N bit digital input word.

At this point it should be emphasized that the circuitry is simplified in FIG. 2 for the purpose of explaining the invention, and is intended to represent various implementations of logic circuits that electrically connect conductor 201 to the lower terminal of a selected resistor Ri and electrically connect conductor 202 to the upper terminal of the resistor Ri. For example, the logic circuits could include a decoder 212 as shown which selects one of $2^M$ lines, or it could include a tree arrangement of switches (as shown in subsequently described FIG. 2A) that are directly actuated by the various bit signals of the M-bit MSB subword and their respective complement signals. Or, the logic circuits could include a combination of both techniques. The foregoing discussion of different ways of de-coding also is similarly applicable to the way the tap voltages $V_1$ and $V_2$ are selectively coupled to the various subsequently described differential stages in the interpolation DAC in response to the N-bit LSB subword.

The voltage across any particular string resistor Ri selected by the M-bit MSB subword is linearly interpolated by interpolation DAC 211 according to the value of the LSB subword, and the resulting interpolation voltage is added to $V_1$ to thereby produce a monotonic output voltage $V_{OUT}$ that represents the applied M+N bit digital input word with a resolution of M+N bits. For convenience, interpolation DAC 211 as shown in FIG. 2, for the case wherein N is equal to 2, includes only three of the $2^N-1$ switches that are used for interpolating in response to the N-bit LSB subword; specifically, switches SW1, SW2, and SW3 are shown in FIG. 2. The lower terminal of each of switches SW1, SW2, and SW3 is connected to conductor 201 and conducts $V_1$, which is the voltage of the lower terminal of the selected string resistor Ri. The upper terminal of each of switches SW1, SW2, and SW3 is connected to conductor 202 and conducts the voltage $V_2$ from the upper terminal of the selected resistor Ri. The center electrodes of each of single pole, double throw switches SW1, SW2, and SW3 are connected to conductors 222, 223, and 224, respectively, to establish one of three interpolated values of $V_{OUT}$ between $V_1$ and $V_2$ according to the value of the LSB subword.

For an N-bit LSB subword, interpolation DAC 211 includes $2^N$ differential stages, each including a pair of P-channel transistors having their source electrodes connected to a corresponding tail current source. In the simplified diagram of FIG. 2, N is equal to 2, so interpolation DAC 211 includes differential stages 16, 17, 18, and 19. For all of the $2^N-1$ differential stages excluding the first stage (i.e., stage 16 in FIG. 2), the gate of one of the left P-channel transistors is coupled to the center pole of a corresponding one of the SPDT switches (SW1, SW2 or SW3 in FIG. 2) to receive either $V_1$ or $V_2$. In each of the $2^N$ differential stages, the gate of the right P-channel transistor is coupled to receive the voltage $V_{OUT}$ produced by output/feedback amplifier 205. The $2^N$ differential stages share a single current mirror load circuit including N-channel transistors $Q_{L1}$ and $Q_{L2}$.

In the simplified schematic diagram shown in FIG. 2, differential stage 16 includes P-channel transistors $Q_{0A}$ and $Q_{0B}$ having their source electrodes connected by conductor 226 to a constant tail current source $I_0$. Transistor $Q_{0A}$ has its gate directly connected to $V_1$ conductor 201. The gate of transistor $Q_{0B}$ is connected to $V_{OUT}$ conductor 208. Differential stage 17 includes P-channel transistors $Q_{1A}$ and $Q_{1B}$ having their sources coupled by conductor 227 to constant tail current source $I_1$ and their gates connected to conductors 222 and $V_{OUT}$ conductor 208, respectively. Differential stage 18 includes P-channel transistors $Q_{2A}$ and $Q_{2B}$ having their gates connected to conductor 223 and $V_{OUT}$ conductor 208, respectively, and their sources connected to constant current source $I_2$. Differential stage 19 includes P-channel transistors $Q_{3A}$ and $Q_{3B}$ having their gates connected to conductor 224 and $V_{OUT}$ conductor 208, respectively, and their sources connected by conductor 229 to constant current source $I_3$.

The drains of transistors $Q_{0A}$, $Q_{1A}$, $Q_{2A}$, and $Q_{3A}$ all are connected by conductor 203 to the drain of N-channel dynamic load transistor $Q_{L1}$. Transistors $Q_{0B}$, $Q_{1B}$, $Q_{2B}$, and $Q_{3B}$ have their drain electrodes coupled by conductor 204 to the drain of N-channel dynamic load transistor $Q_{L2}$ and to the gates of both transistors $Q_{L1}$ and $Q_{L2}$. The sources of transistors $Q_{L1}$ and $Q_{L2}$ are connected to V−. The differential stage output conductors 204 and 203 are connected to the (+) and (−) inputs of an amplifier 205, respectively. The analog output voltage $V_{OUT}$ produced on conductor 208 by output/feedback amplifier 205 represents the digital M+N bit input word.

It should be noted that although N-channel transistors $Q_{L1}$ and $Q_{L2}$ are shown as dynamic load devices for the differential stages 16, 17, 18 and 19 and current summing conductors 203 and 204, N-channel folded cascode transistors usually would be preferred to provide the current summing nodes to which current summing conductors 203 and 204 are connected. By way of definition, the term "load device" as used herein is intended to refer to any kind of load device including current mirror transistors $Q_{L1}$ and $Q_{L2}$ as illustrated, load resistors, or folded cascode transistors.

Figure 1:
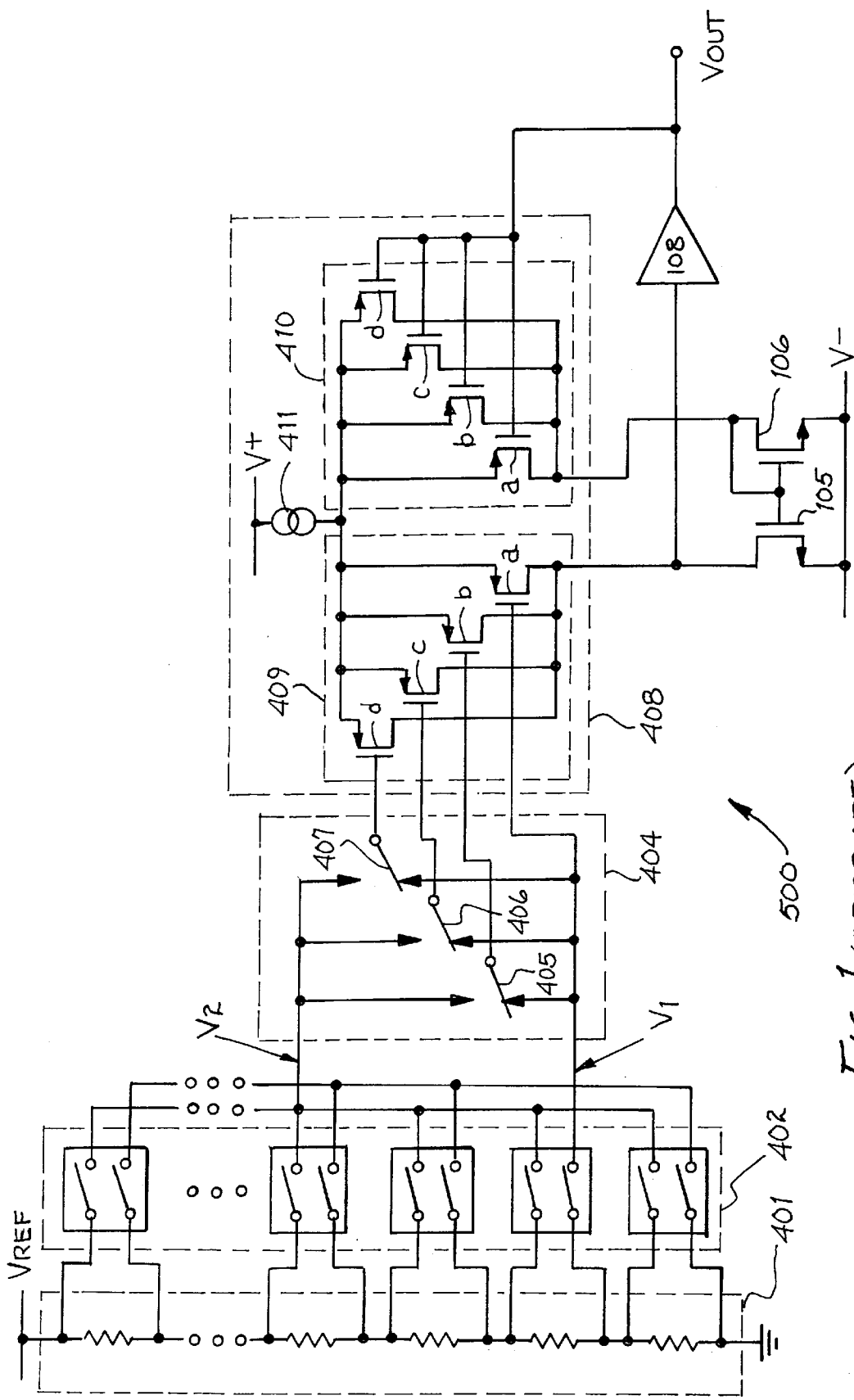
FIG. 1 is a schematic diagram of the closest prior art segmented DAC.
Figure 3:
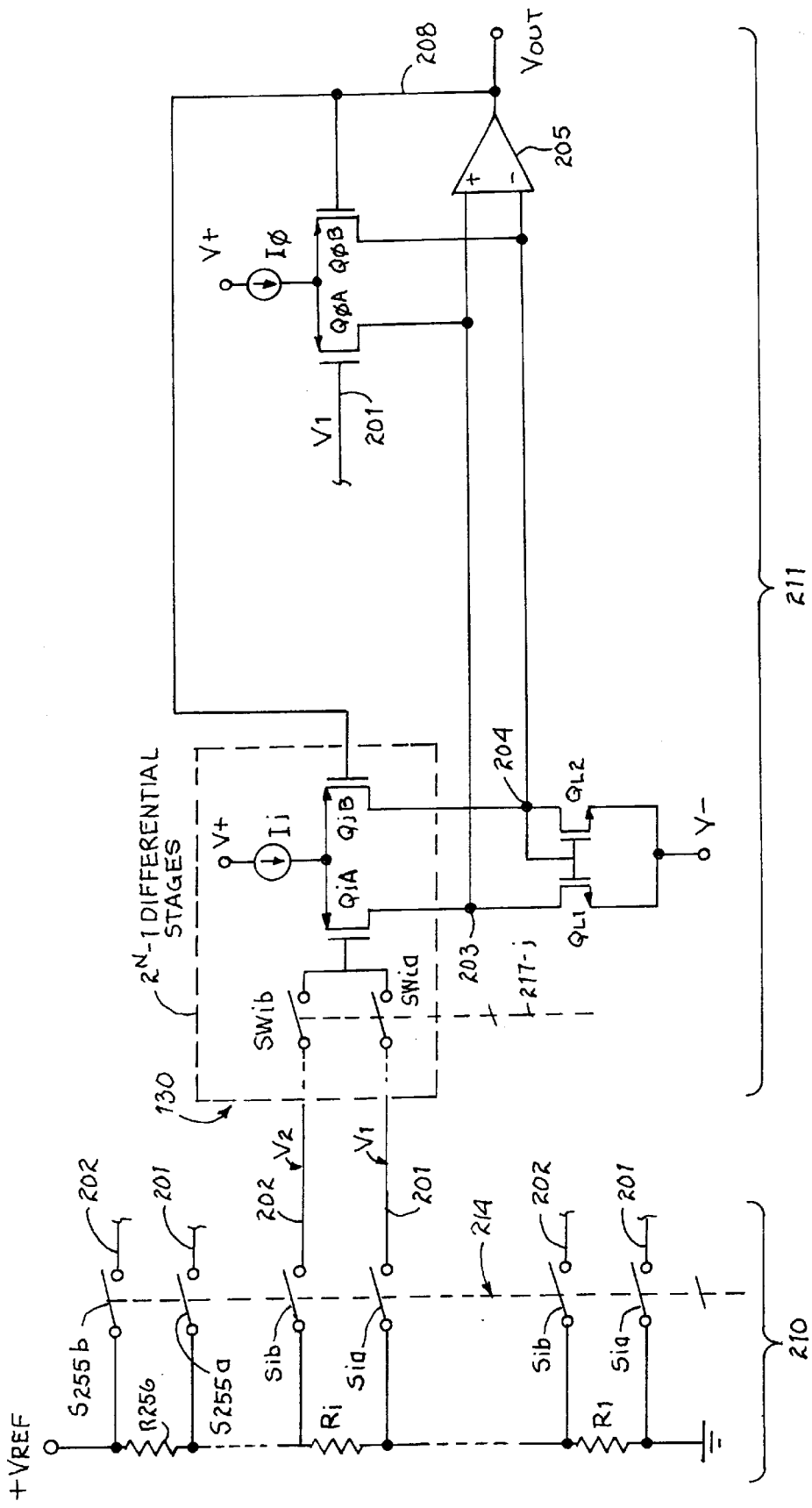
FIG. 3 is a block diagram illustrating implementation of the digital-to-analog converter of FIG. 2 including M most significant bits and N least significant bits.
Figure 3A:
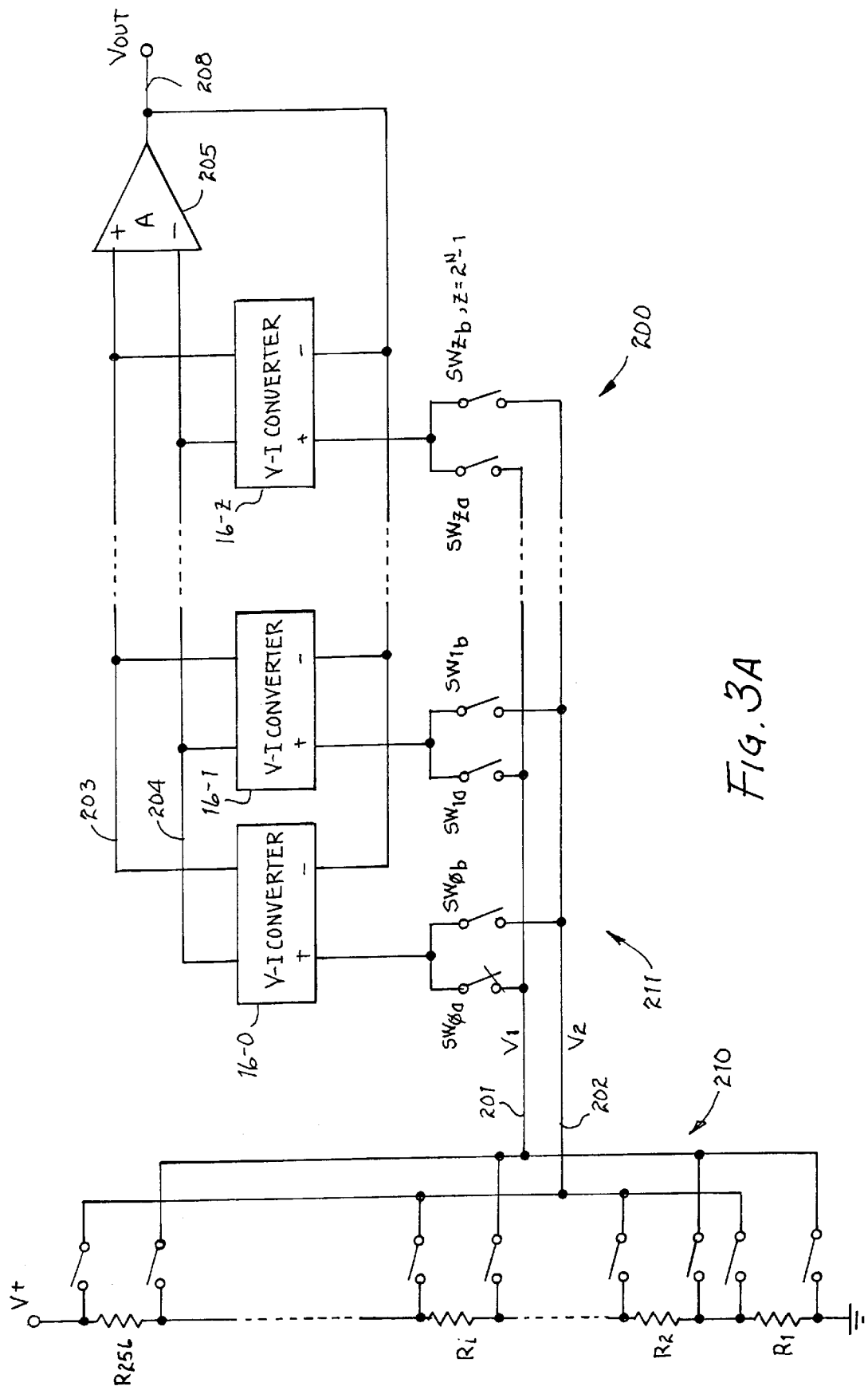
FIG. 3A is a block diagram illustrating a more generalized implementation of the segmented DAC of FIG. 3.
Figure 4:
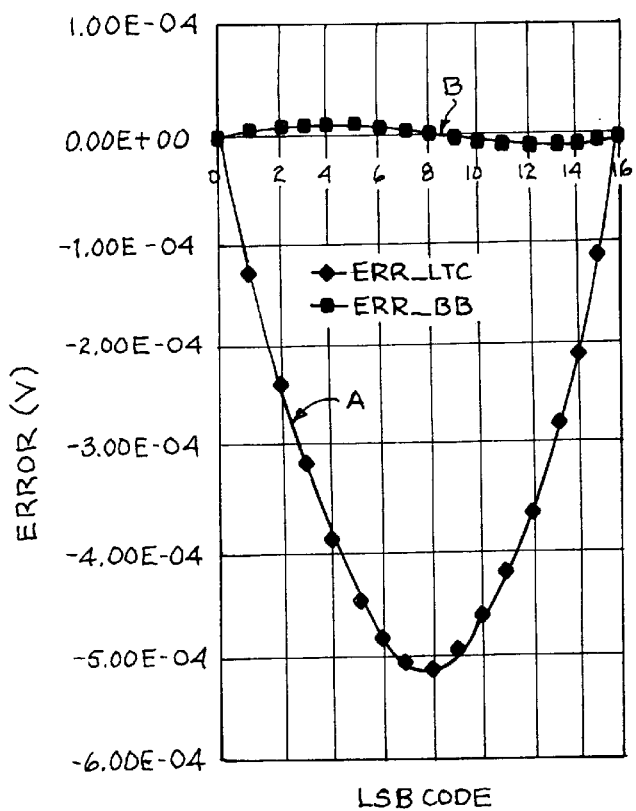
FIG. 4 is a graph illustrating output error curves of the present invention and the closest prior art, as in prior art FIG. 1.

The error curve A of FIG. 4 was obtained for the prior art circuitry shown in FIG. 1 using the well known simulation program HSPICE, and error curve B was obtained for the circuit of FIGS. 2, 3, and 3A using the same program. These curves show that the present invention solves the problems associated with the single tail current differential difference amplifier of U.S. Pat. No. 5,396,245 by much more linearly interpolating between two consecutive tap points of the string resistors Ri than the prior art circuit of FIG. 1, as indicated by curve B in FIG. 4.

Figure 2A:
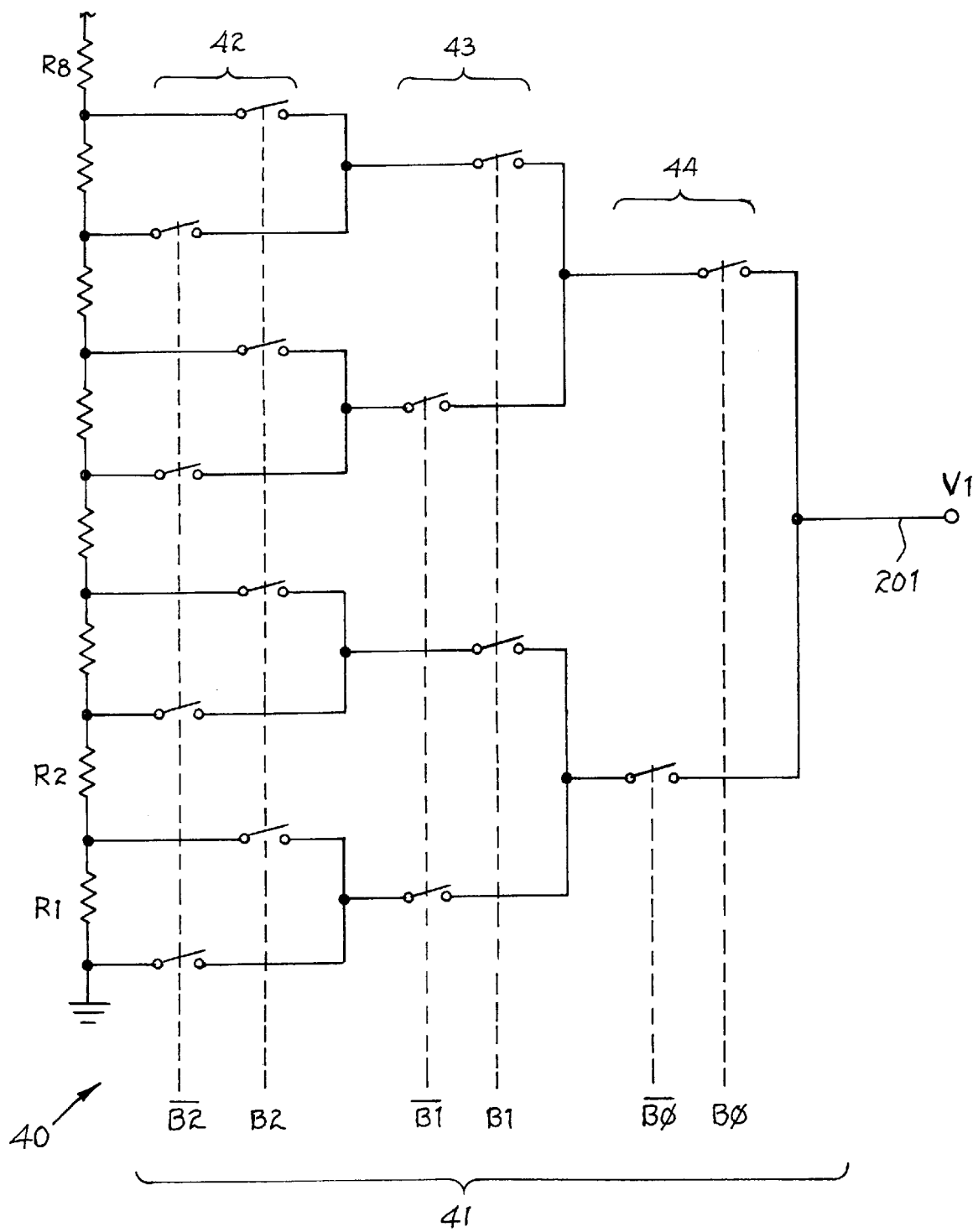
FIG. 2A is a schematic diagram illustrating a tree decoder for coupling tap points of the string DAC section of FIG. 2 to the interpolation DAC.

FIG. 2A shows the above mentioned alternative tree decoding technique that could be used in instead of or in conjunction with MSB subword decoder 212 of FIG. 2 to select the voltage at the bottom terminal of the selected string resistor Ri as the voltage $V_1$ on conductor 201. In this example, numeral 41 designates a decoding tree. A first column of pairs of switches is designated by numeral 42, and the top switch of each pair is closed by bit B2 of the MSB subword and the bottom switch of that pair is closed by $\overline{B2}$. Numeral 43 designates a second column of pair switches; one switch of each such pair is actuated by bit B1 of the MSB subword and the other switch of that pair is actuated by $\overline{B1}$. Finally, numeral 44 designates a pair of switches one of which is actuated by the MSB subword most significant bit B0 and another switch actuated by the $\overline{B0}$. Thus, the three MSB subword bits B0, B1, and B2 select one of the eight tap voltages of the resistor string, starting with ground, as the voltage $V_1$. It should be appreciated that the total number of switches required for decoding can be optimized for a particular application by using the combination of a thermometer code as would be used in the embodiment of FIG. 2 and binary tree decoding as shown in FIG. 2A.

Figure 6A:
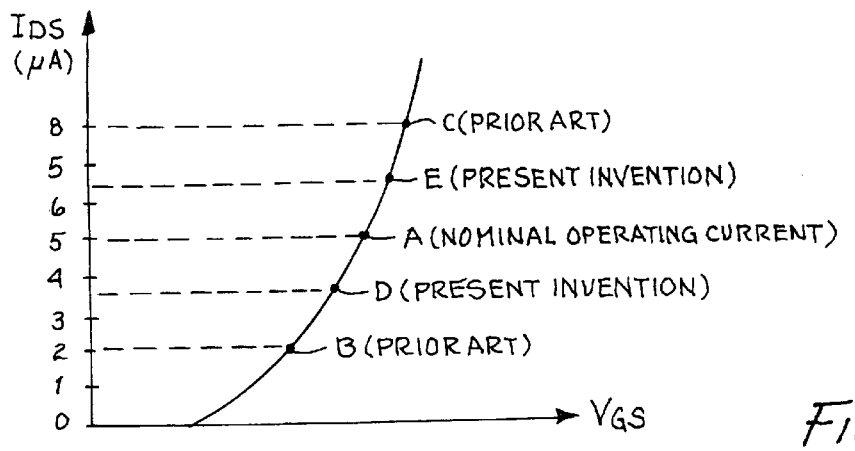
FIGS. 6A–6C are schematic diagrams useful in explaining advantages of the present invention over the prior art of FIG. 1.
Figure 6B:
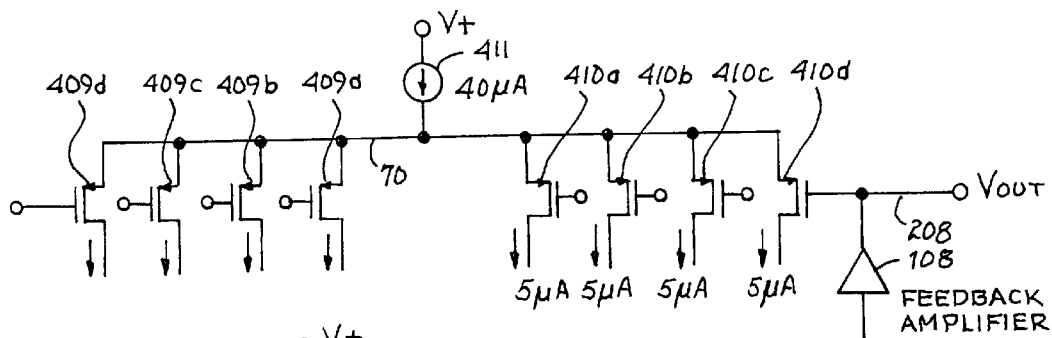
Figure 6C:
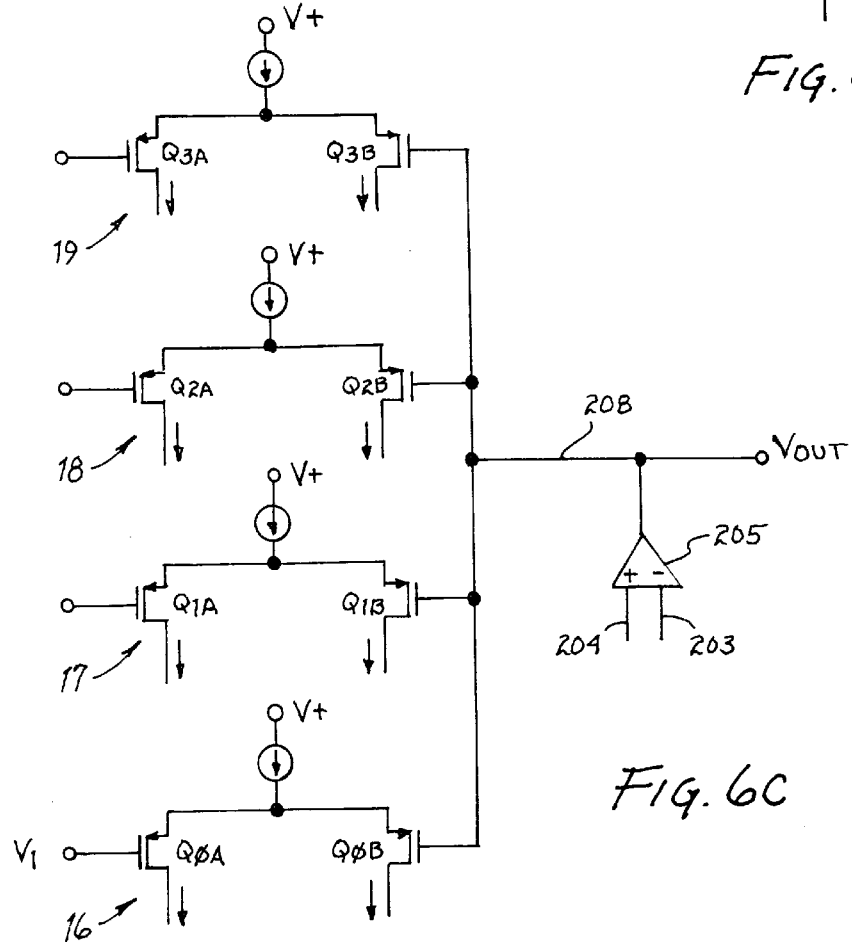

To better understand why use of the above described multiple, fully differential stages of the present invention provides the much more linear interpolation between $V_1$ and $V_2$ than the prior art circuit of FIG. 1, it may be helpful to refer to FIGS. 6A–6C. FIG. 6A shows a transfer characteristic which is a plot of the drain current $I_{DS}$ versus the gate-to-source voltage $V_{GS}$ for each of the identical P-channel MOS transistors 409a,b,c,d and 410a,b,c,d of the single tail current differential stage of the prior art circuit of FIG. 1; the $I_{DS}$ versus $V_{GS}$ curve of FIG. 6A also is the transfer characteristic for the two transistors of each of the four differential stages 16, 17, 18 and 19 in the circuit of FIG. 2. It can be seen that the $I_{DS}$ versus $V_{GS}$ curve of an MOS transistor is a "square-law" curve and is very non-linear, especially at lower values of $V_{GS}$ and $I_{DS}$.

FIG. 6B shows part of the prior art differential stage including four transistors 409a,b,c,d, four transistors 410a,b,c,d, constant current source 411, transistors 105 and 106, and feedback amplifier 108 also shown in FIG. 1. Nominal assumed currents of 5 microamperes in each of the devices are shown for the purpose of this simplified explanation. To explain the non-linear operation of the single differential stage, it is assumed that the tail current source 411 is 40 microamperes. It is also assumed that the difference between $V_2$ and $V_1$ is 4 millivolts, and it is desired to interpolate that 4 millivolt drop to obtain values of $V_{OUT}$ equal to $V_1$, $V_1+1$ millivolt, $V_1+2$ millivolts, or $V_1+3$ millivolts, depending on the value of the LSB subword. Initially, switches 405, 406, and 407 are connected to $V_1$, so the gate voltages of all of transistors 409 are at $V_1$ volts. Since all the gates of transistors 409 are at $V_1$ volts, the differential stage of FIG. 6B becomes completely balanced, because feedback amplifier 108 causes $V_{OUT}$ be equal to $V_1$, and the $I_{DS}$ current flowing through each of the four transistors 409a,b,c,d and each of the four transistors 410a,b,c,d is 5 microamperes. The letter A on the transfer curve of FIG. 6A indicates this initial "nominal" operating point.

Next, it is assumed that switch 405 (FIG. 1) is switched to connect the gate of transistor 409b to $V_2$ (4 millivolts higher than $V_1$) in response to an increment in the value of the LSB subword. It is assumed that this unbalances the single differential stage so as to cause $V_{OUT}$ to increase to $V_1+1$ millivolt. The gates of transistors 410a,b,c,d are all connected to $V_1+1$ millivolts and therefore all have the same unchanged 5 microampere drain current, due to the action of negative feedback and the current mirrors composed of transistors 105 and 106, forcing the two currents from transistors 409 and 410 to be equal to 20 microamperes each; the gates of transistors 410a,b,c,d also all are at the same unchanged $V_{GS}$ voltage. Consequently, the voltage of conductor 70 (FIG. 6B) to which all of the source electrodes are connected also increases by 1 millivolt. Therefore, the $V_{GS}$ voltage of transistor 409b decreases by 3 millivolts, and the $V_{GS}$ voltages of transistors 409a, c, and d increase by 1 millivolt. It is assumed that the slope of the $I_{DS}$ versus $V_{GS}$ curve of FIG. 6A is such that these $\Delta V_{GS}$ changes cause the $I_{DS}$ current of transistor 409b to decrease to 2 microamperes and the $I_{DS}$ currents of transistors 409a, c, and d to increase to 6 microamperes, to thereby provide an unchanged total of 20 microamperes through transistors 409a, b, c and d.

Next, it will be assumed that switch 406 is also switched to $V_2$ in response to another increment in the value of the LSB subword. It therefore is assumed that $V_{OUT}$ increases from $V_1+1$ millivolt to $V_1+2$ millivolts, which is what is supposed to happen for the second interpolation level. That causes the voltage of the common source conductor 70 of all of transistors 409a,b,c,d and 410a,b,c,d to increase another millivolt (or 2 millivolts above $V_1$). Again, there is no change in the $I_{DS}$ currents or $V_{GS}$ voltages of any of transistors 410a,b,c,d. However, this causes changes in the $V_{GS}$ voltages of each of the transistors 409a,b,c,d, so the $I_{DS}$ currents of transistors 409a and 409d for the assumed slope of the $I_{DS}$ versus $V_{GS}$ curve of FIG. 6A are 7 microamperes, and the $I_{DS}$ currents of transistors 409b and 409c are 3 microamperes. Similarly, the final increment in the value of the LSB subword connects switch 407 from $V_1$ to $V_2$, which causes $V_{OUT}$ to increase from $V_1+2$ millivolts to $V_1+3$ millivolts. This causes changes in the $V_{GS}$ voltages of transistors 409a, b, c, and d, and causes the $I_{DS}$ currents of transistors 409b, c, and d to be 4 microamperes and causes the $I_{DS}$ current of transistor 409a to be 8 microamperes.

Thus, in the interpolation operation of the prior art circuit of FIG. 1 the $I_{DS}$ currents of the input transistors 409a, b, c and d vary from 2 microamperes to 8 microamperes. These points are indicated by B and C, respectively, on the transfer characteristic of FIG. 6A.

It can be seen that this range of $I_{DS}$ currents occurs over a very non-linear portion of the input transistor transfer characteristic. This non-linearity shows that the assumption of perfectly linear operation in the above example is an incorrect assumption, and indicates why the error curve A of FIG. 4 for the prior art circuit of FIG. 1 is very non-linear.

Next, a similar analysis will be explained for the circuit of FIG. 6C, which repeats a portion of FIG. 2 showing the four differential stages 16–19 in interpolation DAC 211 of FIG. 2, operating to interpolate the same 4 millivolt voltage drop $V_2-V_1$ across the selected string resistor as in the foregoing analysis for the prior art circuit of FIG. 1. Switches SW1, SW2, and SW3 (FIG. 2) are initially connected to $V_1$. Each of the four differential stages has its own tail current of 10 microamperes, the total of the four tail currents thus being equal to the same 40 microampere total tail current used in the above analysis for the single differential stage of the prior art circuit of FIG. 1. Since the gates of the transistors $Q_{0A}$, $Q_{1A}$, $Q_{2A}$, and $Q_{3A}$ of the four differential stages are at $V_1$ volts, feedback amplifier 205 causes $V_{OUT}$ to be equal to $V_1$. Consequently (for the same assumed slope of the $I_{DS}$ versus $V_{GS}$ curve as in the previous analysis for FIG. 6B), a 5 microampere $I_{DS}$ current flows through each of the input transistors of the four differential stages, respectively.

Next, it is assumed that switch SW1 of FIG. 2 switches the gate of transistor $Q_{1A}$ from $V_1$ to $V_2$. It also is assumed that $V_{OUT}$ is increased by 1 millivolt. Since each of the differential stages has it own tail current source, each conductor connecting the sources of the two input transistors of each differential stage, respectively, changes by one-half of the net voltage change that occurs on the gates of the same two input transistors of that differential stage. This is in direct contrast to the single differential stage of prior art FIG. 1 in which the $V_{GS}$ voltages and $I_{DS}$ drain currents of the four transistors 410a, b, c and d never change, and the common source conductor voltage always changes by exactly the same amount as $V_{OUT}$. (Stated somewhat differently, the composite differential stage of the prior art circuit of FIG. 1 is not "fully differential", while each of the four differential stages of FIG. 2 operates in a fully differential mode.)

Thus, only one-half of the 1 millivolt increase in $V_{OUT}$ appears on the common source conductors of transistors $Q_{0A}$ and $Q_{0B}$, $Q_{2A}$ and $Q_{2B}$, and $Q_{3A}$ and $Q_{3B}$, respectively, and half of the 3 millivolt change between $V_{OUT}$ and the 4 millivolt increase in the gate voltage of transistor $Q_{1A}$ appears on the sources of transistors $Q_{1A}$ and $Q_{1B}$. Therefore, the sources of transistors $Q_{1A}$ and $Q_{1B}$ increase by 2.5 millivolts. These changes cause the $I_{DS}$ currents of transistors $Q_{0A}$, $Q_{2A}$, and $Q_{3A}$ to be 5.5 microamperes, and also cause the $I_{DS}$ currents of transistors $Q_{1A}$ and $Q_{1B}$ to be 3.5 microamperes and 6.5 microamperes, respectively.

Note that the common source voltages of the four differential stages 16–19 in FIG. 6C vary only one-half as much for each increment of the LSB subword in the present invention as is the case for the prior art circuit of FIG. 1.

Repeating the foregoing analysis when switch SW2 connects the gate of transistor $Q_{2A}$ from $V_1$ to $V_2$ shows that the $I_{DS}$ currents of $Q_{0A}$, $Q_{1B}$, $Q_{2B}$, and $Q_{3A}$ are 6 microamperes and the $I_{DS}$ currents of $Q_{0B}$, $Q_{1A}$, $Q_{2A}$, and $Q_{3B}$ are 4 microamperes. When switch SW3 connects the gate of $Q_{3A}$ to $V_2$ in response to the next increment of the LSB subword, then the $I_{DS}$ current of Q0A is 6.5 microamperes, the $I_{DS}$ current of Q0A is 6.5 microamperes, the $I_{DS}$ current of Q0B is 3.5 microamperes, the $I_{DS}$ currents of Q1A, $Q_{2A}$, and $Q_{3A}$ are 4.5 microamperes, and the $I_{DS}$ currents of Q1B, $Q_{2B}$, and $Q_{3B}$ are 5.5 microamperes.

Thus, the $I_{DS}$ currents for the circuit of FIG. 2 vary between 3.5 microamperes and 6.5 microamperes, rather than the 2 microampere to 8 microampere range for the prior art circuit of FIG. 1. The minimum and maximum $I_{DS}$ currents for the circuit of FIG. 2 are indicated by the letters D and E, respectively, on the transfer characteristic of FIG. 6A. This ±1.5 microampere range of variation between points D and E in $I_{DS}$ currents occurs over a substantially more linear portion of the transfer characteristic than is the case for the excursions of the $I_{DS}$ currents between points B and C for the prior art circuit of FIG. 1.

Even though this is a small amount of non-linearity between points D and E, this non-linearity is totally cancelled out at the midpoint of the interpolation range. This occurs when switches SW1 and SW2 are connected to $V_2$, the error is balanced for the circuit of FIG. 2, and the errors are largest at the points one fourth and three fourths of the way through the interpolation range. This leads to the lower-magnitude S-shaped error curve B in FIG. 4, which has minimum error at its midpoint crossover, in contrast to the prior art cup-shaped error curve A of FIG. 4 which has a much larger maximum value at the midpoint of the LSB subword code value which generates the zero crossover error point for curve B.

The invention as shown in FIG. 2 and subsequently described FIGS. 3 and 3A minimizes the interpolation error at both ends of the range of values of the LSB subword (i.e., all "0"s and all "1"s) and also at the middle value of the LSB subword. Both the "$Q^{jA}$" transistor and the "$Q_{jB}$" transistors respond to the differential input signal, since the differential stages all are fully differential, in contrast to the prior art circuit of FIG. 1 in which the transistors 410$a,b,c,d$ do not respond to the differential input signals between the gates of the transistors 410 and the gates of the transistors 409. In the circuits of the present invention, the differential currents in the differential stages having one or more $Q_{jA}$ transistors with gates connected to $V_2$ are of opposite polarity to the differential currents in the stages in which the gate of the $Q_{jA}$ transistors are connected to $V_1$. This results in error cancellation which is not present in the prior art circuit of FIG. 1 and thereby results in the nearly linear, slightly S-shaped error curve B in FIG. 4.

FIG. 3 shows a more generalized representation of the same segmented DAC 200 shown in FIG. 2, wherein interpolation DAC 211 responds to a 4-bit LSB subword that linearly and monotonically interpolates the voltage across the selected string resistor Ri (which could be any of string resistors R1,2 . . . 256) into 16 sub-voltages. In FIG. 3 dotted line 230 designates 15 of the 16 separate differential stages of interpolation DAC 200. Each of the 15 (i.e., $2^N-1$) differential stages within dotted line 230 includes two P-channel input transistors $Q_{jA}$ and $Q_{jB}$ with their sources connected to a corresponding constant current source $I_j$. The drains of the input transistors $Q_{jA}$ are connected by conductor 203 to the load circuit including transistors $Q_{L1}$ and $Q_{L2}$ and to the (+) input of output amplifier 205, just as in FIG. 2. The drain of each of the input transistors $Q_{jB}$ is connected by conductor 204 to the (−) input of output amplifier 205, as in FIG. 2.

The SPDT switches such as SW1, SW2 and SW3 in FIG. 2 are alternatively represented as two single pole, single throw (SPST) switches $SW_{ja}$ and $SW_{jb}$, where j has a value of 1 to 15. Each switch $SW_{ja}$ has one terminal connected to $V_1$ and another terminal connected to the gate of the corresponding P-channel input transistor $Q_{jA}$. Each switch $SW_{jb}$ has one terminal connected to $V_2$ and another terminal connected to the gate of the corresponding P-channel input transistor $Q_{jA}$. The 16th differential stage includes transistors $Q_{0A}$ and $Q_{0B}$ having their gates connected directly to $V_1$ and to $V_{OUT}$, respectively. Their sources are connected to current source $I_0$. The drains of transistors $Q_{0A}$ and $Q_{0B}$ are connected to conductors 203 and 204, respectively, just as in FIG. 2.

The 4-bit LSB subword is decoded to produce 15 signals 217-1,2 . . . 15 and their corresponding logical complement signals, collectively indicated by numeral 217-j in FIG. 3, to incrementally decrease the conductivity of all of "subtransistors" $Q_{jA}$ except $Q_{0A}$ when all of the four LSB subword bits are "0"s. In that case, the gates of all of subtransistors $Q_{jA}$ are at $V_1$ volts, and amplifier 205 operates to adjust $V_{OUT}$ to equal $V_1$. If all of the LSB subword bits are "1"s, then all of subtransistors $Q_{jA}$ are connected to $V_2$ except $Q_{0A}$, and $V_{OUT}$ goes to a value that is equal to $V_1+(15/16)$ $\Delta V$, where $\Delta V$ is equal to $V_2-V_1$.

It should be appreciated that the circuit shown in FIGS. 2 and 3 can be generalized as shown in FIG. 3A, in which the interpolation circuit 211 includes differential stages that can be implemented by means of any of a number of voltage-to-current converter (V-I converters). V-I converter 16-0 has its (+) input permanently connected by switch $SW_{0a}$ (or a short circuit) to $V_1$, and switch $SW_{0b}$ is permanently open (i.e., absent). In the remaining Z V-I converters (where Z is equal to $2^N-1$), switches $SW_{Za}$, $SW_{Zb}$ etc. are connected as shown in FIG. 3A. The current summing conductors 203 and 204 are connected to the (+) and (−) inputs of a generalized current-to-voltage converter 205 which provides feedback by means of its output 208 connected to the (−) inputs of V-I converters 16-0,1 . . . Z. (If amplifier 205 can respond directly to input currents, then no load devices are required. However, if MOSFET gate electrodes are used to receive the input signal or signals for amplifier 205, then the currents in conductors 203 and 204 must be converted to voltages which are applied to the MOSFET gate electrodes. The previously described load devices $Q_{L1}$ and $Q_{L2}$ function as current-to-voltage converters.)

Figure 5A:
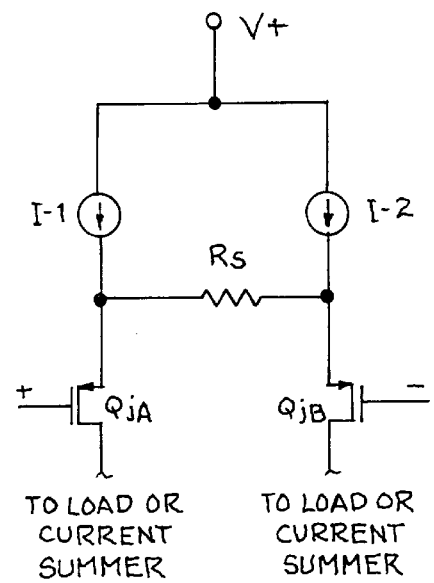
FIGS. 5A–5C are schematic diagrams of various voltage-to-current converters or transconductance stages that can be used in the interpolation DAC section of FIG. 3A.
Figure 5B:
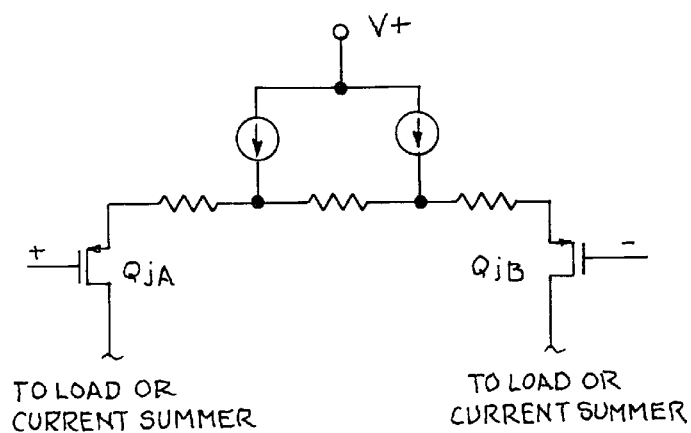
Figure 5C:
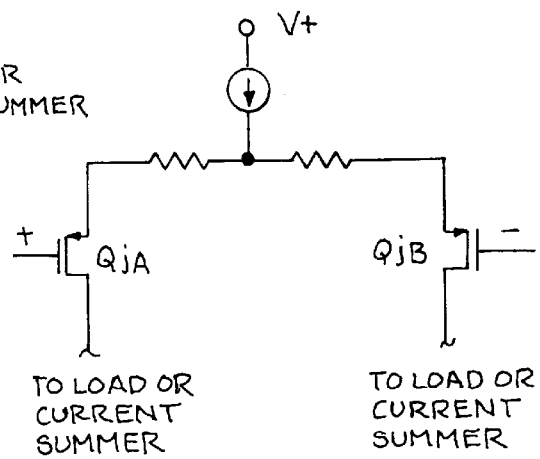

FIGS. 5A–5C show three different practical implementations of the V-I converters shown in FIG. 3A. In FIG. 5A, a source degeneration resistor $R_S$ is coupled between the sources of differential stage input transistors $Q_{jA}$ and $Q_{jB}$. In this configuration, two equal current sources I-1 and I-2 are used. Use of the source degeneration resistor $R_S$ further increases the linearity. FIG. 5B shows another variation on the same theme, and FIG. 5C shows a third variation on the same idea.

The invention has enabled the inventor to provide a very accurate monotonic 12-bit DAC in a chip that is small enough to fit in a standard SOT23 package.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, the output/feedback amplifier 205 could be either a differential-input-to-single-ended-output amplifier or a single-ended-input-to-single-ended-output amplifier. Furthermore, the differential stages could be provided with binarily weighted tail currents so as to produce the same interpolated $V_{OUT}$ levels as for the previously described examples. Furthermore, a hybrid variant using both thermometer decoding and binary decoding could be provided. The basic idea of the invention is also workable for a bipolar transistor implementation, especially if base current cancellation techniques are used.

What is claimed is:

1. An interpolation circuit for digitally interpolating between a first voltage on a first conductor and a second voltage on a second conductor, comprising:

(a) a plurality of voltage-to-current converter circuits each including a non-inverting input, an inverting input, and a current source establishing a bias current in the voltage-to-current converter;

(b) an amplifier coupled to produce an output voltage in response to the sum of a plurality of currents produced by the plurality of voltage-to-current converter circuits, the output voltage being coupled to the inverting input of each of the voltage-to-current converter circuits, the current produced by each voltage-to-current converter being related to the bias current in that voltage-to-current converter; and (c) a switching circuit adapted to selectively couple the non-inverting inputs of corresponding voltage-to-current converter circuits to one or the other of the first and second conductors in response to a plurality of digital bit signals, respectively.

2. The interpolation circuit of claim 1 including a current-to-voltage converter circuit coupled to apply a voltage to an input of the amplifier corresponding to the sum of the plurality of currents.

3. An interpolation circuit for digitally interpolating between a first voltage on a first conductor and a second voltage on a second conductor comprising:

(a) a plurality of differential voltage-to-current converter circuits each including a first transistor and a second transistor each having a first electrode coupled to a corresponding current source;

(b) an output amplifier producing an output voltage coupled to a control electrode of each of the second transistors;

(c) a switch circuit adapted to selectively couple control electrodes of corresponding first transistors to one or the other of the first conductor and the second conductor in response to a plurality of digital bit signals, respectively; and (d) a first load device coupled by a third conductor to a second electrode of each of the first transistors and an inverting input of the output amplifier, and a second load device coupled by a fourth conductor to a second electrode of each of the second transistors and a non-inverting input of the output amplifier.

4. The interpolation circuit of claim 3 wherein the first and second transistors are MOSFETs, the first electrodes are source electrodes, the second electrodes are drain electrodes, and the control electrodes are gate electrodes.

5. The interpolation circuit of claim 4 wherein the W/L ratio of the P-channel MOSFETs are equal.

6. The interpolation circuit of claim 4 wherein the current sources are equal.

7. The interpolation circuit of claim 4 wherein at least some of the current sources are binarily weighted.

8. The interpolation circuit of claim 3 wherein each first transistor is a P-channel MOSFET having a source electrode coupled to the corresponding current source and a drain electrode coupled to the first load device, and each second transistor is a P-channel MOSFET having a source electrode coupled to the corresponding current source and a drain electrode coupled to the second load device.

9. The interpolation circuit of claim 8 wherein the first load device includes a first N-channel MOSFET having a drain electrode coupled to the drain electrode of the P-channel MOSFETs constituting the first transistors, and the second load device includes a second N-channel MOSFET having a drain electrode coupled to the drain electrodes of the P-channel MOSFETs constituting the second transistors.

10. The interpolation circuit of claim 9 wherein the first and second N-channel MOSFETs are cascode transistors of a folded cascode circuit.

11. An M+N bit digital-to-analog converter (DAC) for monotonically converting an M+N bit input word including an M-bit MSB subword and an N-bit LSB subword to an analog output signal, comprising:

(a) a string DAC section including
  I. a plurality of series-connected string resistors,
  ii. a first switching circuit adapted to both selectively couple a first terminal of each string resistor to a first conductor and selectively couple a second terminal of each resistor to a second conductor in response to the MSB subword so as to selectively couple voltages on the first and second terminals of selected string resistors to the first and second conductors, respectively; and (b) an interpolation DAC section for digitally interpolating between a first voltage on the first conductor and a second voltage on the second conductor, including
  I. a plurality of voltage-to-current converter circuits each including a non-inverting input, an inverting input, and a current source establishing a bias current in the voltage-to-current converter,
  ii. an output amplifier coupled to produce an output voltage in response to the sum of a plurality of currents produced by the plurality of voltage-to-current converter circuits, the output voltage being coupled to a gate of each of the second transistors, the current produced by each voltage-to-current converter being related to the bias current in that voltage-to-current converter,
  iii. a second switching circuit adapted to selectively couple the non-inverting inputs of corresponding voltage-to-current converter circuits to one or the other of the first and second conductors in response to the LSB subword, respectively.

12. The M+N bit digital-to-analog converter of claim 11 including a current-to-voltage converter circuit coupled to apply a voltage to an input of the amplifier corresponding to the sum of the plurality of currents.

13. An M+N bit segmented digital-to-analog converter (DAC) for monotonically converting an M+N bit input word including an M-bit MSB subword and an N-bit LSB subword to an analog output signal, comprising:

(a) a string DAC section including
  i. a plurality of series-connected string resistors,
  ii. a first switching circuit adapted to both selectively couple a first terminal of each string resistor to a first conductor and selectively couple a second terminal of each resistor to a second conductor in response to the MSB subword so as to selectively couple voltages on the first and second terminals of selected string resistors to the first and second conductors, respectively; and (b) an interpolation DAC section including
  i. a plurality of differential voltage-to-current converter circuits each including a first transistor and a second transistor each having a source coupled to a corresponding current source,
  ii. an output amplifier producing an output voltage coupled to a gate of each of the second transistors,
  iii. a second switching circuit adapted to selectively couple gates of corresponding first transistors to one or the other of the first and second conductors in response to the LSB subword, respectively, and
  iv. a first load device coupled by a third conductor to the drains of the first transistors and an inverting input of the output amplifier, and a second load device coupled by a fourth conductor to the drains of the second transistors and a non-inverting input of the output amplifier.

14. The M+N bit segmented digital-to-analog converter of claim 13 wherein the first switching circuit includes a tree decoder section.

15. The M+N bit segmented digital-to-analog converter of claim 13 wherein the first switching circuit includes a tree decoder section including tree decoder switches responsive to at least some bits of the M-bit MSB subword, and a plurality of additional switches responsive to a decoder adapted to decode at least some of the other bits of the M-bit MSB subword.

16. An M+N bit segmented digital-to-analog converter (DAC) for monotonically converting an M+N bit input word including both an M-bit MSB subword and an N-bit LSB subword to an analog output signal, comprising:
   (a) a string DAC section including
      i. a plurality of series-connected string resistors,
      ii. a first switching circuit coupling a first terminal of each string resistor to a first conductor and coupling a second terminal of each resistor to a second conductor, and
      iii. MSB subword decoding circuitry coupled to the first switching circuit and adapted to decode the MSB subword and actuate the switch circuitry so as to selectively couple voltages on the first and second terminals of a selected string resistor to the first and second conductors, respectively; and
   (b) an interpolation DAC section including
      i. an LSB subword decoder adapted to decode the LSB subword to produce switch actuation signals in response to the LSB subword,
      ii. a plurality of differential voltage-to-current converter circuits each including a first transistor and a second transistor each having a source coupled to a corresponding current source,
      iii. an output amplifier producing an output voltage coupled to a gate of each of the second transistors,
      iv. a second switching circuit coupled to the LSB subword decoder and adapted to selectively couple gates of corresponding first transistors to one or the other of the first and second conductors in response to the LSB subword, respectively, and
      v. a first load device coupled by a third conductor to the drains of the first transistors and an inverting input of the output amplifier, and a second load device coupled by a fourth conductor to the drains of the second transistors and a non-inverting input of the output amplifier.

17. The M+N bit segmented digital-to-analog converter of claim 16 wherein the MSB subword decoding circuitry includes an M-bit MSB decoder circuit responsive to at least some of the bits of the M-bit MSB subword to generate a plurality of selection signals each operative to actuate the first switching circuit to couple a first or second terminal of the selected resistor to the first or second conductor, respectively.

18. The M+N bit segmented digital-to-analog converter of claim 16 wherein the first switching circuit includes a tree decoder section.

19. The M+N bit segmented digital-to-analog converter of claim 16 wherein the first switching circuit includes a tree decoder section including tree decoder switches responsive to at least some bits of the M-bit MSB subword, and a plurality of additional switches responsive to a decoder adapted to decode at least some of the other bits of the M-bit MSB subword.

20. A method of interpolating between a first voltage and a second voltage, comprising:
   (a) providing a plurality of fully differential stages each including a first input transistor and a second input transistor and a tail current source coupled to both a source electrode of the first input transistor and a source electrode of the second input transistor, a gate electrode of each second input transistor being coupled to an output of a feedback amplifier circuit, the number of the fully differential stages determining the number of interpolated voltage levels available between the first and second voltages;
   (b) coupling a gate electrode of each of a first predetermined number of the first input transistors to the second voltage and a gate electrode of each of a second predetermined number of the first input transistors to the first voltage, the first predetermined number being determinative of a desired interpolated voltage level between the first and second voltages;
   (c) conducting drain currents of all of the first input transistors into a first summing conductor, and conducting drain currents of all of the second input transistors into a second summing conductor; and
   (d) operating the feedback amplifier to adjust the voltage on the gate electrodes of the second input transistors in response to the currents in the first and second summing conductors so as to equalize the currents in the first and second summing conductors, the voltage of the gates of the second input transistors being equal to the desired interpolated voltage level.

21. A method of interpolating between a first voltage and a second voltage, comprising:
   (a) providing a plurality of fully differential voltage-to-current converter stages each having an inverting input coupled to an output of a feedback amplifier circuit, each voltage-to-current converter stage including a current source establishing a bias current in that voltage-to-current converter stage, the number of the fully differential voltage-to-current converter stages determining the number of interpolated voltage levels available between the first and second voltages;
   (b) coupling a non-inverting input of each of a first predetermined number of the voltage-to-current converter stages to the second voltage and a non-inverting input of each of a second predetermined number of the voltage-to-current converter stages to the first voltage, the first predetermined number being determinative of a desired interpolated voltage level between the first and second voltages;
   (c) conducting currents in non-inverted outputs of all of the voltage-to-current converter stages into a first summing conductor, and conducting currents in inverted outputs of all of the voltage-to-current stages into a second summing conductor, the current produced by each voltage-to-current converter stage being related to the bias current in that voltage-to-current converter stage; and
   (d) operating the feedback amplifier to adjust the voltage on the inverting inputs of all of the voltage-to-current converter stages in response to the currents in the first and second summing conductors so as to equalize the currents in the first and second summing conductors, the voltage of the inverting inputs of the voltage-to-current converter stages being equal to the desired interpolated voltage level.

* * * * *